(12) United States Patent
Kitaoka

(10) Patent No.: US 6,891,927 B2
(45) Date of Patent: May 10, 2005

(54) LIGHT GENERATION APPARATUS, EXPOSURE APPARATUS, AND DEVICE MANUFACTURING METHOD

(75) Inventor: Atsushi Kitaoka, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/464,477

(22) Filed: Jun. 19, 2003

(65) Prior Publication Data

US 2004/0007990 A1 Jan. 15, 2004

(30) Foreign Application Priority Data

Jun. 24, 2002 (JP) ........................................ 2002-183377

(51) Int. Cl.⁷ ................................................ H05G 1/24
(52) U.S. Cl. ...................... 378/103; 378/34; 250/492.2
(58) Field of Search .......................... 378/34, 101–103, 378/111; 250/492.2; 315/240, 241; 320/166

(56) References Cited

U.S. PATENT DOCUMENTS

| 4,170,734 A | * | 10/1979 | Woodruff ..................... 378/107 |
| 4,378,501 A | * | 3/1983 | Cowell ......................... 378/97 |
| 4,475,223 A | * | 10/1984 | Taniguchi et al. ............ 378/34 |
| 5,586,159 A | | 12/1996 | Kitaoka et al. ............... 378/34 |
| 6,323,623 B1 | * | 11/2001 | Someya et al. ............. 320/166 |
| 6,552,798 B1 | | 4/2003 | Ina et al. .................... 356/493 |
| 2002/0141533 A1 | | 10/2002 | Kitaoka ....................... 378/34 |

FOREIGN PATENT DOCUMENTS

JP  9-184900  7/1997

* cited by examiner

Primary Examiner—Craig E. Church
Assistant Examiner—Jurie Yun
(74) Attorney, Agent, or Firm—Fitzpatrick, Cella, Harper & Scinto

(57) ABSTRACT

A light generation apparatus is capable of widely changing the intensity of generated light. The light generation apparatus includes an X-ray source, a high-voltage generation circuit, and a CPU. The high-voltage generation circuit has a plurality of capacitors, and a plurality of switches, which are arranged on the charging and discharging paths of the capacitors. The CPU controls the switches to switch a capacitor for supplying electric energy to the X-ray point source, thereby changing electric energy supplied to the X-ray point source.

15 Claims, 9 Drawing Sheets

FIG. 4

| S1 | S2 | S3 | S4 | S5 | S6 | C1 | C2 | C3 |
|---|---|---|---|---|---|---|---|---|
| OFF | * | * | OFF | * | * | KEEP STATE | * | * |
| * | OFF | * | * | OFF | * | * | KEEP STATE | * |
| * | * | OFF | * | * | OFF | * | * | KEEP STATE |
| ON | * | * | ON | * | * | CHARGE | * | * |
| * | ON | * | * | ON | * | * | CHARGE | * |
| * | * | ON | * | * | ON | * | * | CHARGE |
| OTHER COMBINATIONS ARE INHIBITED | | | | | | | | |

\* MEANS Don't care

FIG. 6

| | CAPACITOR USE STATE | TOTAL CAPACITANCE (RELATIVE) | X-RAY INTENSITY (RELATIVE) | X-RAY INTENSITY RANGE ($3\alpha$, RELATIVE) |
|---|---|---|---|---|
| ○ | C1 | 30% | 8% | 2~14% |
| | C2 | 35% | 10% | 2.5~17.5% |
| | C3 | 35% | 10% | 2.5~17.5% |
| | C1+C2 | 65% | 25% | 6.3~43.8% |
| | C1+C3 | 65% | 25% | 6.3~43.8% |
| | C2+C3 | 70% | 28% | 7~49% |
| ○ | C1+C2+C3 | 100% | 100% | 25~75% |

LIGHT GENERATION APPARATUS, EXPOSURE APPARATUS, AND DEVICE MANUFACTURING METHOD

FIELD OF THE INVENTION

The present invention relates to a light generation apparatus, an exposure apparatus, and a device manufacturing method.

BACKGROUND OF THE INVENTION

Various types of exposure apparatuses are used to manufacture microdevices such as ICs and LSIs. The exposure apparatus has an exposure light source, and exposes a photoresist-coated wafer to a pattern (e.g., a circuit pattern) formed on a master such as a mask or reticle with light generated by the exposure light source.

For a higher integration degree of microdevices, the wavelength of the exposure light source must be shortened. As one of short-wavelength exposure light source candidates, an X-ray light source has been proposed and developed. Of such light sources, an X-ray point source which is smaller in size and lower in cost than a synchrotron, and a stand-alone light source used as an EUV (Extreme UltraViolet) light source receives a great deal of attention. These light sources generate X-rays and EUV light whose intensities change like pulses.

In order to realize a high throughput in X-ray exposure and EUV exposure, the intensity of light to be output and the sensitivity of the resist must be increased. The intensity per pulse is being increased for obtaining high-intensity pulse X-rays or pulse EUV light. However, the pulse intensity and pulse rate basically have a trade-off relationship, and room is left for improvements of both the pulse intensity and pulse rate.

Exposure of a substrate such as a wafer requires high-accuracy exposure amount control. For example, in many cases, the line width accuracy in pattern exposure at a minimum line width of 100 nm or less must be equal to or lower than ±10% of the minimum line width. One of the factors which decrease the line width accuracy is the exposure amount error. The exposure amount accuracy depends on the error budget and the processing step, and is desirably some tenths of a percentage.

The pulse X-ray intensity of the current pulse X-ray source is known to suffer from a large dispersion. For example, as shown in FIG. 3, the dispersion at 3σ reaches several tens percent. Even if the cumulative exposure amount is measured, the intensity of the final pulse is adjusted, and light is emitted with a given target value, a predetermined cumulative exposure amount accuracy cannot be obtained due to the dispersion in the final pulse. This problem becomes more serious as the number of exposure pulses per shot decreases by increasing the pulse intensity per pulse.

Let i be the average of the X-ray intensity per pulse, and D be the exposure amount target value of one shot. In this case, an average number N of pulses per shot is given by:

$N=D/i.$

Letting S be the dispersion in the X-ray intensity of each pulse at 3σ in generating the number of pulses by a target value, an exposure amount error E of one shot due to the intensity dispersion is given by:

$E=S/N.$

For S=75% and N=200, E=0.375%. This value may not be so large with respect to the exposure amount error target value (e.g., 0.2%). In practice, the average of an actual pulse intensity at N=200 readily shifts from the average i of the pulse intensity for a sufficient number of samples. The cumulative exposure amount greatly disperses for each shot. That is, the number N of pulses=200 is too small, and the average of the actual pulse intensity may shift from a statistical average.

In general, therefore, the cumulative exposure amount per shot is measured by a measurement device, and when the pulse intensity average at one shot shifts from i, the number of pulses is increased/decreased. In this case, the cumulative amount up to a pulse before the final pulse can be generally detected with sufficient accuracy. However, the intensity of the final pulse disperses, and the cumulative exposure amount can only attain an accuracy:

$E=S/N.$

In a plasma X-ray source, as shown in FIG. 2, the X-ray conversion efficiency becomes higher for a larger input energy of one pulse. In general, the generation efficiency of the X-ray source is not so high, and an increase in X-ray conversion efficiency is very effective for increasing power. For this reason, X-ray source vendors have developed X-ray sources for a larger input energy per pulse. As a result, it becomes more difficult to increase the cumulative exposure amount, as described above.

In exposure by an excimer laser beam similarly using pulse-like energy, the pulse intensity can be easily decreased by decreasing the laser discharging voltage. The exposure amount accuracy is improved by decreasing the pulse intensity near the final portion in each exposure shot.

It is also proposed to control the pulse X-ray intensity by changing the laser beam intensity of a laser plasma X-ray source, as disclosed in Japanese Patent Laid-Open No. 9-184900.

One of pulse X-ray sources excites X-rays by discharge energy. A so-called dense plasma focus device belongs to this type. This type of source does not use any laser, and the above-mentioned intensity control by a laser beam cannot be adopted.

There is a method of adjusting the X-ray intensity of a discharge pulse X-ray source by the discharging voltage. The adjustment method using the discharging voltage is generally employed in intensity adjustment of a pulse laser beam. This method has various merits such as high response, continuous intensity adjustment, and the absence of any complicated arrangement. When, however, the adjustment method using the discharging voltage is applied to the discharge pulse X-ray source, discharge may become unstable or a generated wavelength may change upon greatly changing the discharging voltage.

SUMMARY OF THE INVENTION

The present invention has been made in consideration of the above situation, and has as its object to provide a new apparatus for changing the intensity of generated light.

According to the first aspect of the present invention, there is provided a light generation apparatus which generates light, comprising (a) a light source arranged to generate light upon reception of electric energy, (b) an electric energy supply circuit arranged to have a plurality of capacitors and a plurality of switches which are arranged on charging paths and/or discharging paths of the plurality of capacitors, and to supply electric energy accumulated in all or some of the plurality of capacitors to the light source, and (c) a controller arranged to control the plurality of switches and change an intensity of electric energy supplied to the light source. In this manner, a plurality of capacitors, and a plurality of switches which are arranged on the charging paths and/or discharging paths of the capacitors are adopted. These switches are controlled to change the intensity of electric energy supplied to the light source, thereby widening the changeable range of electric energy supplied to the light source.

According to a preferred aspect of the present invention, the plurality of switches are preferably so arranged as to allow the controller to individually control charge/discharge of the plurality of capacitors.

According to another preferred aspect of the present invention, at least two of the plurality of capacitors preferably have different electrostatic capacitances.

Alternatively, the controller may control the plurality of switches so as to supply electric energy to the light source by using a capacitor of a first group out of the plurality of capacitors in a first state, and supply electric energy to the light source by using a capacitor of a second group out of the plurality of capacitors in a second state. In this case, at least one of the plurality of capacitors may belong to both the first and second groups. Alternatively, each capacitor belonging to the first group may be different from each capacitor belonging to the second group.

According to still another preferred aspect of the present invention, the controller preferably changes the intensity of electric energy supplied to the light source by controlling the plurality of switches on the basis of a cumulative value of intensity of light generated by the light source. The light generation apparatus preferably further comprises a sensor arranged to obtain the cumulative value of the intensity of light generated by the light source.

The controller preferably controls the plurality of switches so as to supply electric energy of a first intensity to the light source at once until the cumulative value of the intensity of light generated by the light source reaches a predetermined value smaller than a target cumulative value, and then controls the plurality of switches so as to supply electric energy of a second intensity smaller than the first intensity to the light source at once.

According to still another preferred aspect of the present invention, the light generation apparatus preferably further comprises a circuit arranged to adjust a voltage of electric energy supplied from the electric energy supply circuit to the light source.

According to still another preferred aspect of the present invention, the light source preferably generates pulse light by electric energy supplied from the electric energy supply circuit.

According to still another preferred aspect of the present invention, the light source generates, e.g., X-rays or-extreme ultraviolet (EUV) rays.

According to the second aspect of the present invention, there is provided a light generation apparatus which generates light, comprising (a) a light source arranged to generate light upon reception of electric energy, (b) an electric energy supply circuit arranged to have a capacitor which accumulates electric energy, and to supply the electric energy accumulated in the capacitor to the light source, and (c) a controller arranged to change the electric energy accumulated in the capacitor and to change the electric energy supplied to the light source. By changing electric energy accumulated in the capacitor, the changeable range of electric energy supplied to the light source can be widened.

According to the third aspect of the present invention, there is provided an exposure apparatus comprising the above-described light generation apparatus, and a substrate holding portion arranged to hold a substrate so as to print a pattern on the substrate or a three-dimensional object with light generated by the light generation apparatus.

According to the fourth aspect of the present invention, there is provided a device manufacturing method comprising steps of printing a pattern on a substrate or three-dimensional object coated with a photosensitive agent by using the above-described exposure apparatus, and developing the substrate or three-dimensional object.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 4 is a table showing a combination of switches according to the preferred embodiment of the present invention;

FIG. 6 is a table for explaining the X-ray intensity adjustment method according to the preferred embodiment of the present invention;

DETAILED DESCRIPTION OF THE PREFERRED EMBODIMENT

A preferred embodiment of the present invention will be described below with reference to the accompanying drawings.

The preferred embodiment of the present invention will describe an X-ray stepper which transfers a mask pattern onto a wafer by step & repeat. However, the present invention is not limited to this embodiment.

Figure 1:
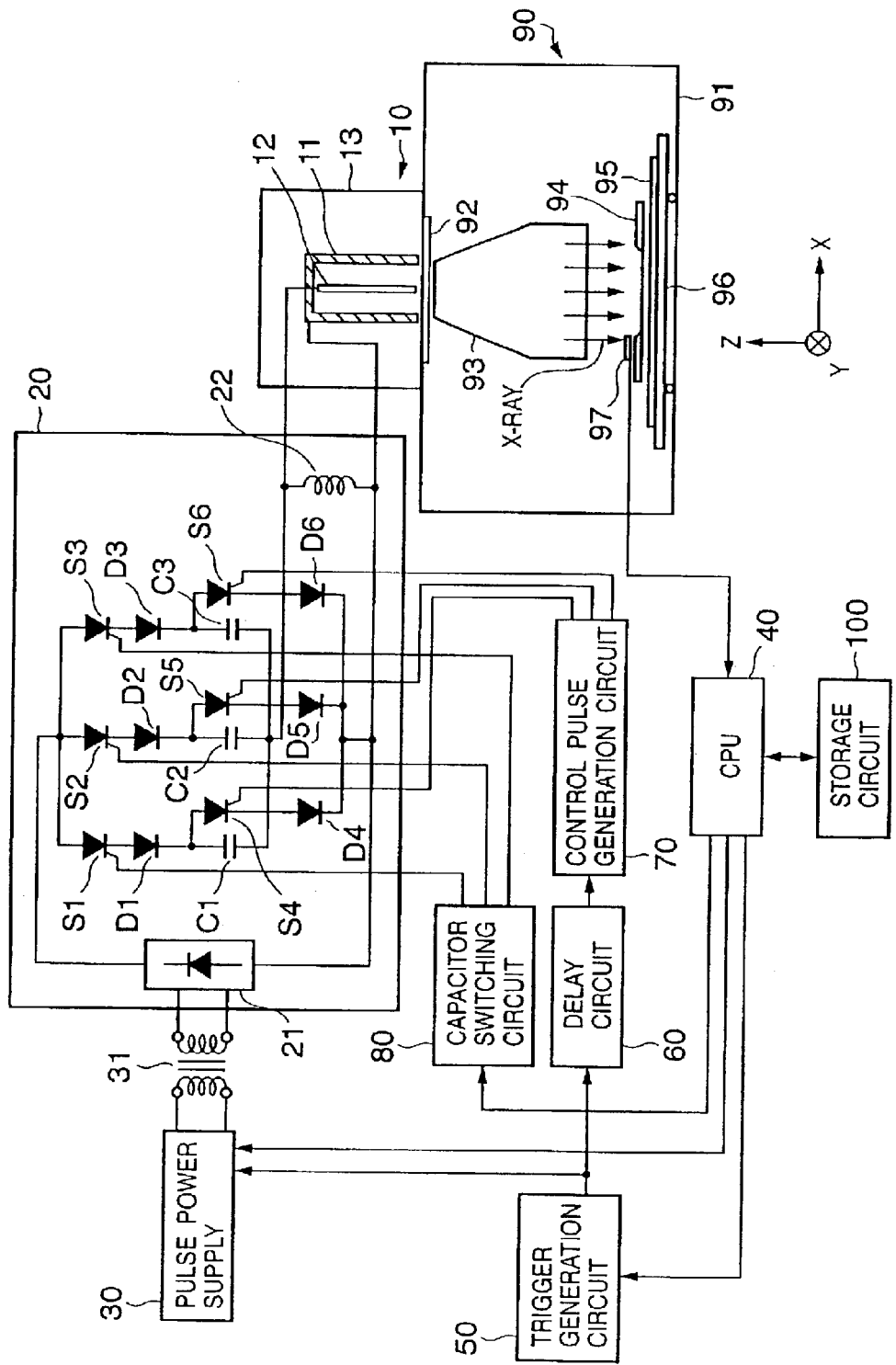
FIG. 1 is a view showing the schematic arrangement of an X-ray exposure system according to a preferred embodiment of the present invention.
Figure 2:
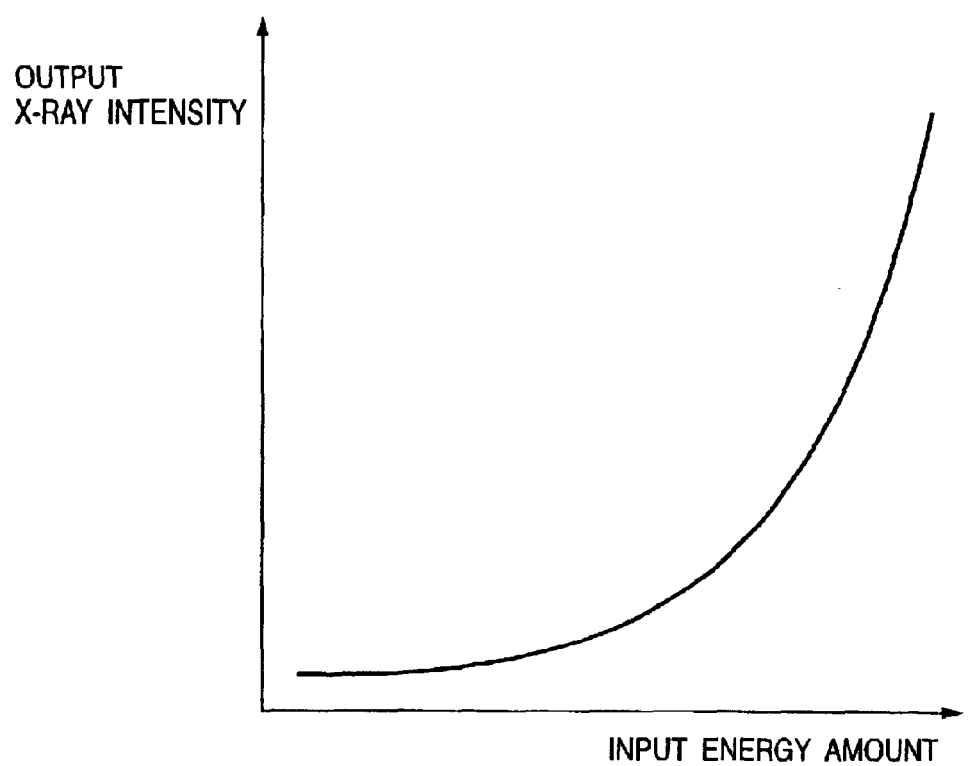
FIG. 2 is a graph showing an example of the input/output characteristic of a plasma X-ray source.
Figure 3:
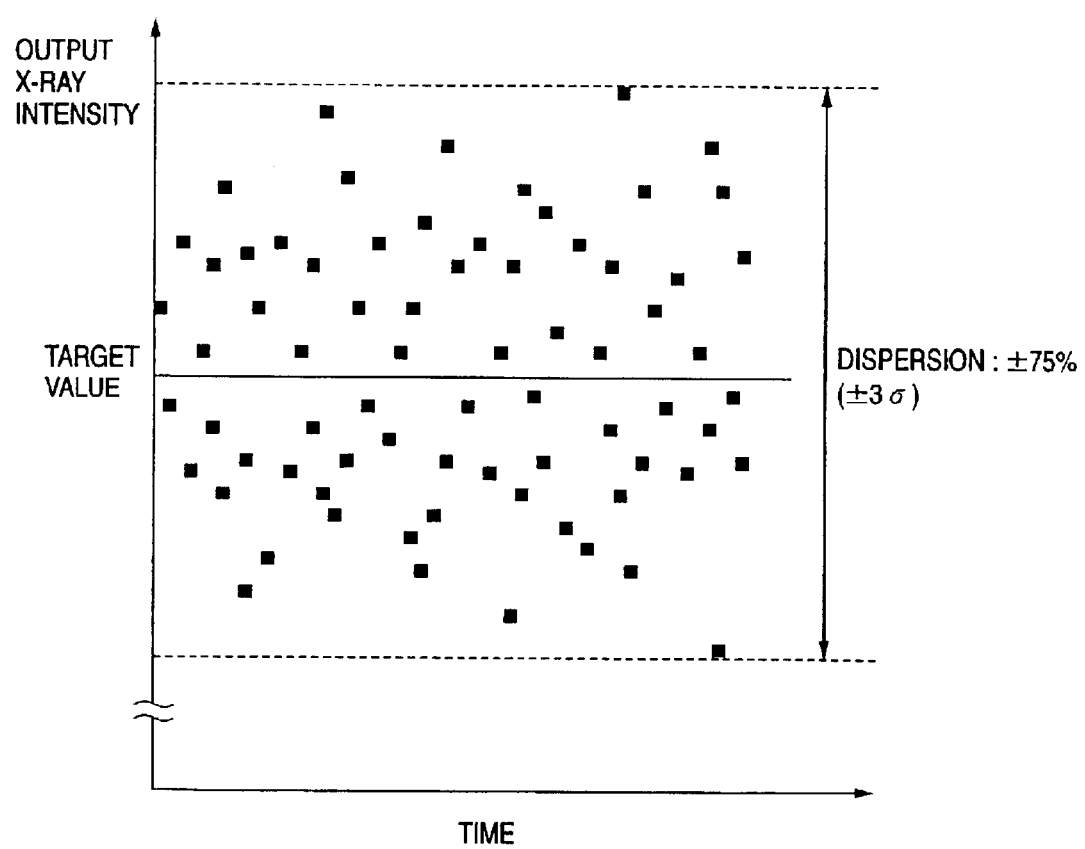
FIG. 3 is a graph showing an example of the dispersion in the X-ray intensity of a pulse X-ray source.

FIG. 1 is a view showing the schematic arrangement of an X-ray exposure system using an X-ray point source according to the preferred embodiment of the present invention. The X-ray point source of the embodiment is of a dense plasma focus type. Ne (Neon) gas serving as an X-ray excitation target is filled at a low pressure in a chamber 13 of an X-ray point source 10. The target is not limited to gas, and may be a solid or liquid.

The atmospheric pressure can be typically set to several Pa to several tens of Pa, but is about 13 Pa in the embodiment. First and second electrodes 11 and 12 are coaxially arranged. The embodiment does not employ another preliminary ionization electrode. In the embodiment, the first and second electrodes 11 and 12 are designed to coaxially generate preliminary ionization at part of the first and second electrodes 11 and 12 by elaborating their shapes. The X-ray point source 10, including the first and second electrodes 11 and 12, generates, as heat, energy which does not contribute to X-ray generation. The X-ray point source 10 is preferably cooled with water by a cooling system (not shown).

A high-voltage discharge circuit (electric energy supply circuit) 20 will be explained. A rectifier 21 converts an AC voltage supplied from a pulse power supply 30 via a transformer 31 into a DC voltage. The rectifier 21 is connected to the positive terminals of charging/discharging capacitors C1 to C3 via charging semiconductor switches S1 to S3 and high-breakdown-voltage diodes D1 to D3. The negative terminals of the charging/discharging capacitors C1 to C3 are commonly connected to a charging coil 22 and the second electrode 12. The first electrode 11 is connected to the other terminal of the charging coil 22 and also to the return side of the rectifier 21. The positive terminals of the charging/discharging capacitors C1 to C3 are connected to discharging semiconductor switches S4 to S6.

The pulse power supply 30 decides a discharging voltage in response to a command from a CPU (controller) 40. A trigger generation circuit 50 decides the pulse rate and the presence/absence of a trigger in response to a command from the CPU 40. The trigger pulse is provided to the pulse power supply 30 and a delay circuit 60. The delay circuit 60 corrects timing characteristics unique to the X-ray source 10 and the capacitors C1 to C3. A control pulse generation circuit 70 drives the switches S4 to S6 in accordance with an output from the delay circuit 60. A capacitor switching circuit 80 individually switches in accordance with a command from the CPU 40 between a state in which the capacitors C1 to C3 are disconnected and a state in which they are charged/discharged.

An exposure apparatus 90 is covered with a sealed chamber 91, and filled with high-purity helium at 20 kPa as an internal atmosphere. A pressure partition (X-ray window) 92 using a beryllium foil is arranged at the connection portion between the X-ray source chamber 13 of the X-ray point source 10 and the sealed chamber 91 of the exposure apparatus 90. X-rays are introduced into the sealed chamber 91 of the exposure apparatus 90 via the pressure partition 92. A collimator 93 is installed in the exposure apparatus 90 to increase the X-ray use efficiency. The use efficiency is increased by decreasing the distance between the collimator 93 and the X-ray generation position. Considering this, the collimator 93 is set at an upper portion in the exposure apparatus 90 in the embodiment. However, the collimator 93 may be integrated with the X-ray point source 10, or the X-ray point source 10, collimator 93, and exposure apparatus 90 may be arranged in independent chambers. In many cases, the collimator 93 is preferably used to decrease the X-ray use efficiency and the divergence angle. In a simpler system, a desired specification can also be achieved by omitting the collimator 93 and arranging a mask 94 and wafer 95 closer to the X-ray point source 10 serving as a light source.

The mask 94 and wafer 95 are respectively set on a mask stage (not shown) and a wafer stage 96 by transfer systems (not shown). The mask stage (not shown) comprises, e.g., Z-axis, Z-tilt-axis, and θ-axis control mechanisms. The wafer stage 96 comprises, e.g., X-axis, Y-axis, θ-axis, Z-axis, and Z-tilt-axis control mechanisms. While step & repeat is repeated, a pattern on the mask 94 is transferred at once to exposure shot areas on the wafer 95, exposing a predetermined number of shots on the mask 94. The exposure field angle can be decided by a masking blade (not shown).

The embodiment adopts a cell projection system utilizing a wide field angle which is a feature of X-ray proximity exposure. However, the present invention is not restricted to cell projection or proximity exposure. In other words, the present invention can also be applied to a sync scan exposure system (so-called scanner) of scanning a mask and wafer in synchronism with each other, and an exposure system using a reduction optical system. The present invention can also be applied to an EUV exposure system.

Figure 5:
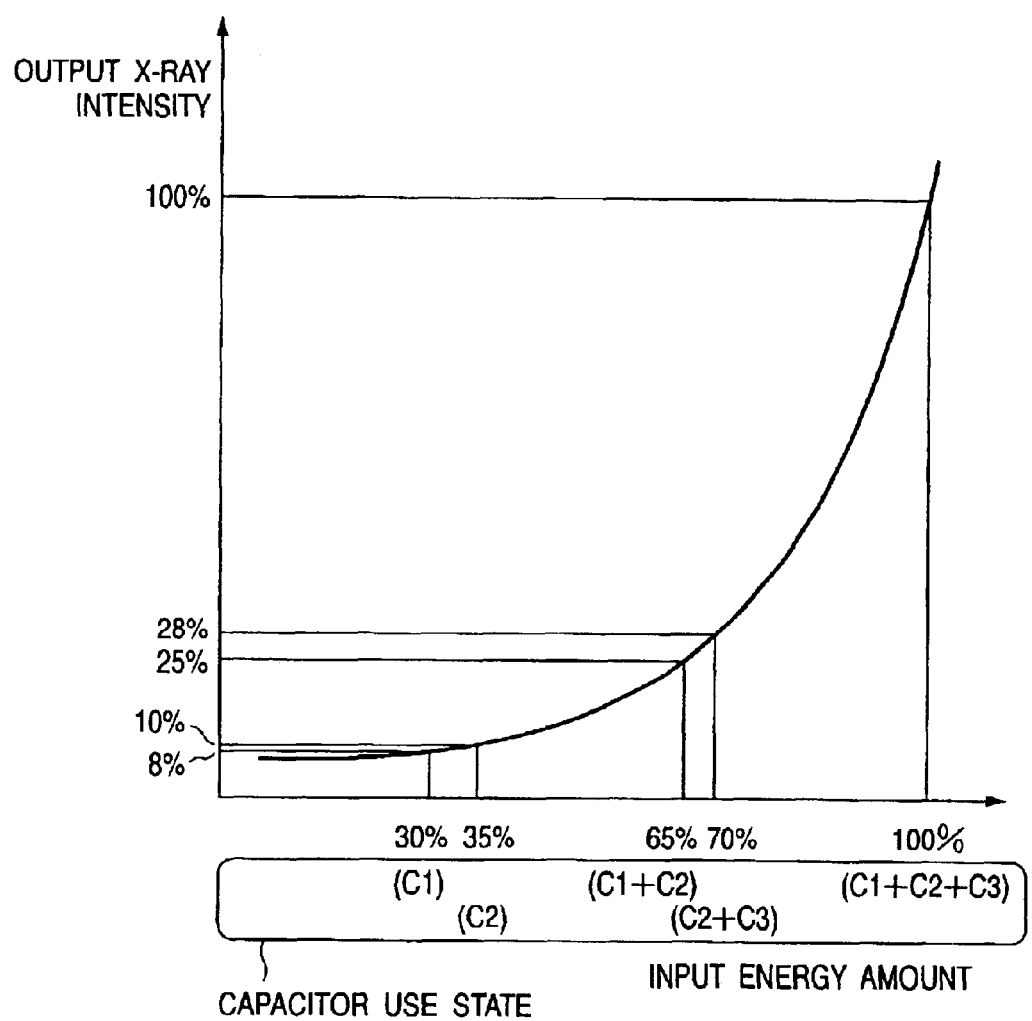
FIG. 5 is a graph for explaining an X-ray intensity adjustment method according to the preferred embodiment of the present invention.

The charging semiconductor switches S1 to S3 are elements for switching whether to charge the charging/discharging capacitors C1 to C3. The discharging semiconductor switches S4 to S6 are elements for controlling discharge of the charging/discharging capacitors C1 to C3. A combination of the states of S1 to S6 and their operations are shown in FIGS. 4 and 5.

For example, when both S1 and S4 are OFF, the capacitor C1 is neither charged nor discharged. This also includes a case wherein C1 has already been charged. At this time, S2, S3, S5, and S6 can take any state except an inhibited combination. The time necessary for charge is typically different between a case wherein only C1 is charged and a case wherein C1 and another capacitor are simultaneously charged. The time depends on each capacitor capacitance and the abilities of the pulse power supply 30, transformer 31, and rectifier 21. As for discharge, no timing limitation is posed. Almost simultaneous discharge of a plurality of capacitors requires strict adjustment for increasing the X-ray generation efficiency.

Detection of the exposure amount will be explained. An X-ray intensity sensor 97 is set outside the exposure area in the exposure apparatus 90. The sensor 97 can measure the X-ray intensity (and cumulative exposure amount) in real time even during exposure. The X-ray intensity sensor 97 may be set in the X-ray point source 10. In this case, the detection value changes due to debris deposited on the sensor surface.

The CPU 40 has a function of time-integrating the detection value of the X-ray intensity sensor 97 for each shot. The CPU 40 also has a function of calculating the average pulse intensity at a given time interval.

The CPU 40 outputs a command to the capacitor switching circuit 80 to set all C1 to C3 in the charge/discharge mode in order to supply, e.g., a maximum electric energy to the X-ray point source 10 so as to start exposure of a target shot. The CPU 40 controls the pulse power supply 30 and trigger generation circuit 50 to supply electric energy discharged from the charging/discharging capacitors C1 to C3 from the high-voltage generation path 20 to the X-ray point source 10. This electric energy is intermittently supplied in synchronism with an X-ray discharge trigger signal generated by the trigger generation circuit 50.

In the charge/discharge mode, a charging semiconductor switch corresponding to a capacitor to be charged is turned on by the capacitor switching circuit 80, and after electric energy is accumulated in the capacitor, turned off. A discharging semiconductor switch corresponding to the capacitor is turned on in accordance with an output from the control pulse generation circuit 70, and electric energy accumulated in the capacitor is discharged.

The CPU 40 compares the exposure amount (i.e., time-integrated cumulative exposure amount) at a shot to be exposed with a power-down threshold value held in a storage circuit 100 in advance, and when the exposure amount exceeds the power-down threshold value, outputs a power-down command. The power-down command means to decrease the intensity of electric energy supplied at once from the high-voltage generation circuit 20 to the X-ray point source 10, and includes a command (1). Preferably, the power-down command further includes a command (2) and/or command (3).

(1) The CPU 40 outputs a command to the capacitor switching circuit 80 to set C1 in the charge/discharge mode and C2 and C3 in the disconnection mode (mode in which the charging semiconductor switch of a corresponding capacitor is turned off).

(2) The CPU 40 outputs a command to the trigger generation circuit 50 to increase the pulse rate.

(3) The CPU 40 outputs a command to the pulse power supply 30 to finely adjust the charging voltage generated by the pulse power supply 30.

Operation (2) means to increase the pulse rate and shorten the time taken to expose a shot because the time taken for charge becomes short along with a decrease in the number of capacitors to be charged/discharged (in other words, a decrease in charging current). Operation (3) means to finely adjust a charging voltage generated by the pulse power supply 30 and finely adjust a voltage supplied to the X-ray point source 10, thereby finely adjusting the intensity of X-rays generated by the X-ray point source 10.

An X-ray intensity adjustment method using a capacitor according to the preferred embodiment of the present invention will be explained with reference to FIG. 5. The capacitance design values of C1 to C3 are 30%, 35%, and 35% as relative values. In the X-ray point source 10 having an X-ray intensity characteristic corresponding to input energy shown in FIG. 5, the X-ray intensity when each capacitor is connected takes numerical values in the table of FIG. 6. The dispersion in the intensity of pulse X-rays generated by the X-ray point source 10 is about 75% at 3σ regardless of the generation intensity. Under this condition, the generated X-ray intensity at each combination takes a value within the X-ray intensity range (3σ and relative) in the table of FIG. 6.

As a detailed embodiment, two combinations represented by ○ in the table of FIG. 6, i.e., "C1" (first group) and "C1+C2+C3" (second group) can be used. This embodiment assumes that one shot is exposed by 200 pulses as the specification of the X-ray point source 10 and the target exposure amount accuracy is ±0.05%. The 200 pulses are assumed to provide a desired exposure amount at an average pulse intensity in the use of "C1+C2+C3". The intensity of one pulse corresponds to ½₀₀=0.5% of the exposure amount of one shot. The target accuracy is an error of ±0.05% for the exposure amount of one shot. To obtain the target accuracy, the intensity of one pulse is decreased to be equal to or lower than about 10% of the intensity in the use of, "C1+C2+C3" because of 0.05/0.5=0.1. The exposure amount must be so adjusted as to obtain the target accuracy with the number of pulses having this intensity. Based on this assumption, the embodiment decides the capacitance of each capacitor such that the exposure amount in fine adjustment of the exposure amount, i.e., in the use of only C1 can be controlled at a precision of about 8% in comparison with the use of "C1+C2+C3".

This assumption is a design item to be changed in accordance with the X-ray source intensity, resist sensitivity, and the like. The above assumption is merely an example. The number of capacitors, their capacitances, and their combination can also be properly changed. For example, the number of capacitors, their capacitances, and their combination can be decided in accordance with a request for the throughput, target accuracy, or the like.

In the above example, the capacitor C1 belongs to both the first and second groups. Alternatively, capacitors which belong to the first group and capacitors which belong to the second group may be different from each other.

Figure 7:
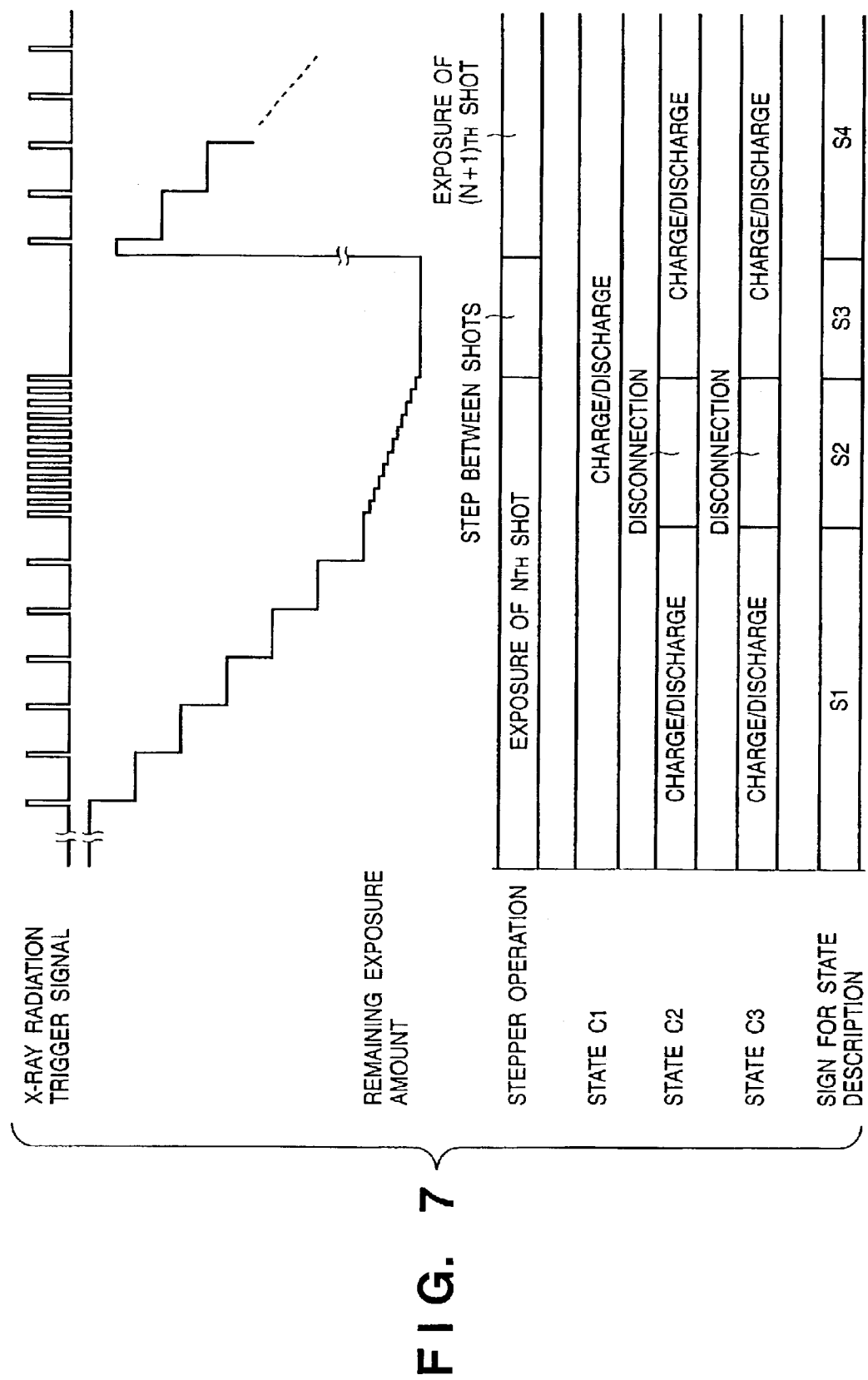
FIG. 7 is a view for explaining the X-ray intensity adjustment method according to the preferred embodiment of the present invention.

Exposure amount control in the preferred embodiment of the present invention will be explained with reference to FIG. 7. The following exposure amount control is executed by the CPU (controller) 40.

(State S1)

In state S1, the Nth shot is exposed by pulse X-rays generated by the X-ray point source 10 while the X-ray point source 10 is driven by charging/discharging the combination (first group) "C1+C2+C3". In this embodiment, most of the cumulative exposure amount of the Nth shot is obtained by the combination "C1+C2+C3". When the remaining exposure amount (i.e., the difference between the target exposure amount and the cumulative exposure amount) becomes about one pulse in the use of "C1+C2+C3", the state is switched to the next state S2.

(State S2)

In state S2, the Nth shot is exposed by pulse X-rays generated by the X-ray point source 10 while the X-ray point source 10 is driven by charging/discharging only C1 (second group) until the remaining exposure amount of the Nth shot (i.e., the difference between the target exposure amount and the cumulative exposure amount) becomes almost 0. More specifically, exposure of the Nth shot is completed when the remaining exposure amount reaches a set allowance (e.g., an error of ±0.05% of the exposure amount of one shot). In state S2, C2 and C3 are not charged, the power supply ability of the pulse power supply 30 has a margin, and the charge/discharge rate of C1 can be increased.

(State S3)

In state S3, the wafer stage 96 is driven step by step from the Nth shot to the (N+1)th shot. Immediately when the state is changed to state S3, charge of C1 and C3 starts to prepare for the next discharge.

(State S4)

State S4 is the same as state S1 except a different shot is to be exposed. Exposure of the (N+1)th shot starts.

That is, this embodiment executes, for all shots on a wafer, exposure of the Nth shot by procedures represented by states S1 to S3 and exposure of the (N+1)th shot by procedures represented by states S1 to S3.

In the above embodiment, the number of capacitors (C1 to C3) is three, and their capacitances are set at a ratio of 30:35:35 with respect to the total capacitance. The number of capacitors and their capacitances can be properly decided, and another preferred example is as follows.

The number of capacitors is set to two (C1 and C2), and the capacitance ratio is set to C1:C2=100:10. The capacitance is so set as to obtain 100% of a desired pulse intensity by only the capacitance of C1. C1 are C2 are respectively dedicated for a large-power pulse and small-power pulse. In this case, the number of capacitors used simultaneously is always one, and the timings of discharging a plurality of capacitors need not be considered.

In the above embodiment, electric energy supplied to the X-ray point source 10 is changed by changing capacitors to be charged/discharged. Instead, for example, a capacitor to be charged/discharged is fixed (e.g., only one capacitor is used), and electric energy accumulated in the capacitor is changed to change electric energy supplied to the X-ray point source 10. Electric energy accumulated in the capacitor can be changed by changing the charging time, charging current, charging voltage, or the like.

As described above, in the light generation apparatus which accumulates electric energy in a capacitor and supplies the electric energy to the light source, a capacitor use method is changed (e.g., the charging path and/or discharging path is changed, or electric energy accumulated in the capacitor is changed). Accordingly, electric energy supplied to the light source can be adjusted to widely change the electric energy supplied to the light source.

Figure 8:
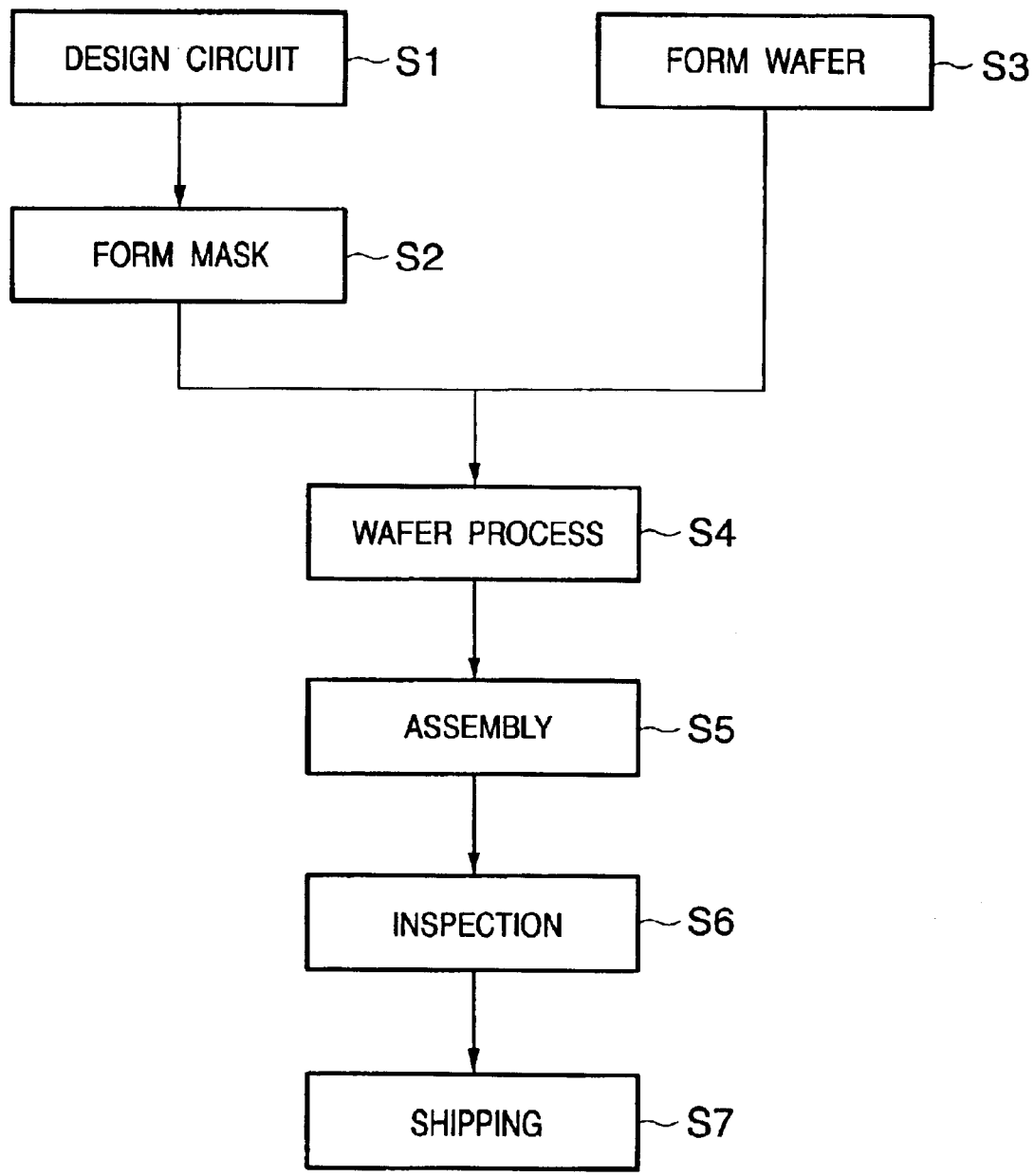
FIG. 8 is a flow chart schematically showing a device manufacturing method.

A semiconductor device manufacturing process using the above-described exposure apparatus will be explained. FIG. 8 shows the flow of the whole manufacturing process of a semiconductor device. In step 1 (circuit design), a semiconductor device circuit is designed. In step 2 (mask formation), a mask having the designed circuit pattern is formed. In step 3 (wafer formation), a wafer is formed using a material such as silicon. In step 4 (wafer-process), called a pre-process, an actual circuit is formed on the wafer by lithography using the mask and wafer. Step 5 (assembly), called a post-process, is the step of forming a semiconductor chip by using the wafer formed in step 4, and includes an assembly process (dicing and bonding) and a packaging process (chip encapsulation). In step 6 (inspection), the semiconductor device manufactured in step 5 undergoes inspections such as an operation confirmation test and a durability test. After these steps, the semiconductor device is completed and shipped (step 7).

Figure 9:
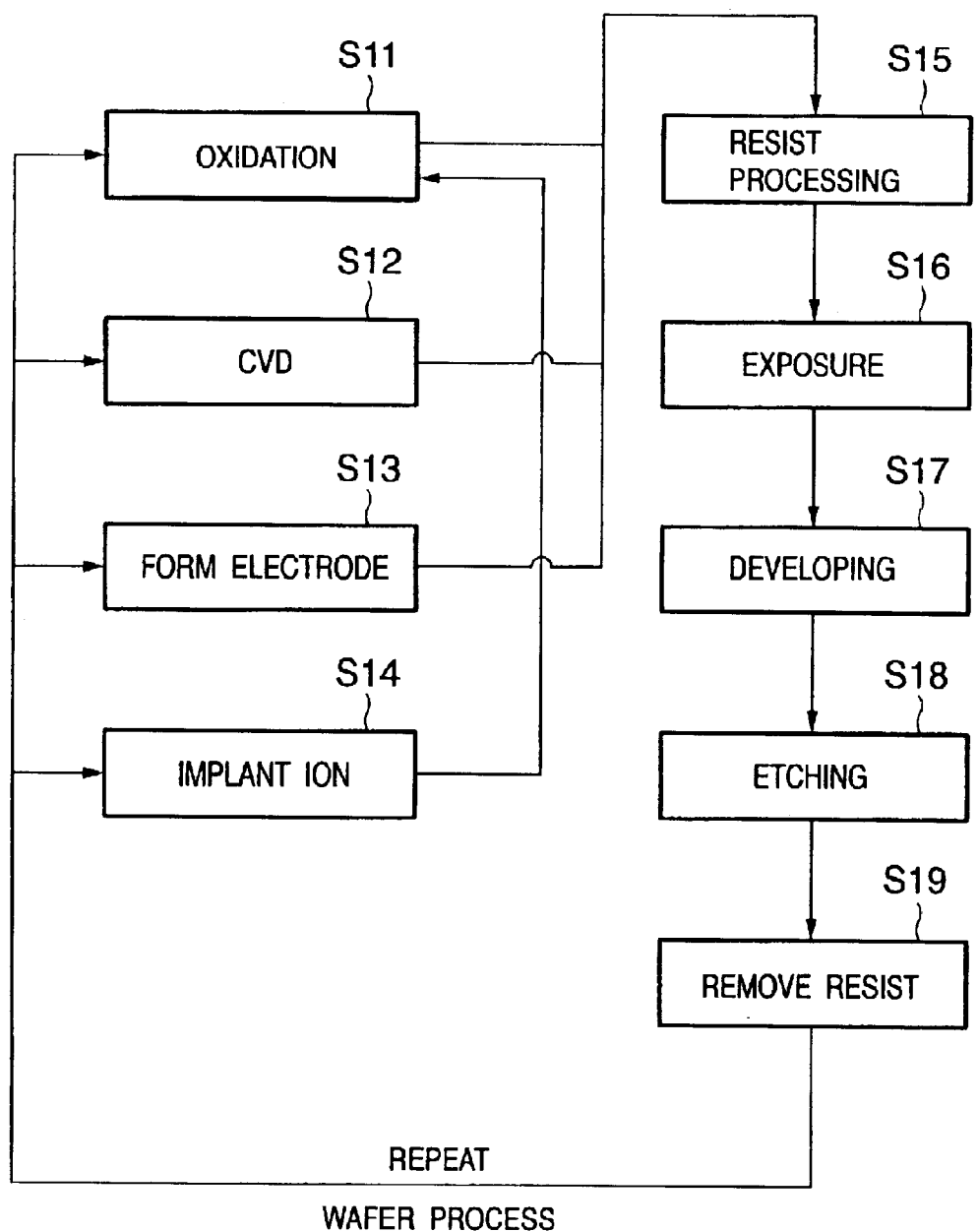
FIG. 9 is a flow chart schematically showing the device manufacturing method.

FIG. 9 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus transfers a circuit pattern onto the wafer. In step 17 (developing), the exposed wafer is developed. In step 18 (etching), the resist is etched except the developed resist image. In step 19 (resist removal), an unnecessary resist after etching is removed. These steps are repeated to form multiple circuit patterns on the wafer.

The present invention can provide a new apparatus for changing the intensity of generated light.

For example, a plurality of capacitors, and a plurality of switches which are arranged on the charging paths and/or discharging paths of the capacitors are adopted. These switches are controlled to change the intensity of electric energy supplied to the light source, thereby widening the changeable range of electric energy supplied to the light source.

As many apparently widely different embodiments of the present invention can be made without departing from the spirit and scope thereof, it is to be understood that the invention is not limited to the specific embodiments thereof except as defined in the claims.

What is claimed is:

1. A generation apparatus which generates one of an X-ray and an extreme ultraviolet ray, said apparatus comprising:
   a source which generates one of the X-ray and the extreme ultraviolet ray upon reception of electric energy;
   an electric energy supply circuit which has a plurality of capacitors and a plurality of switches for charging and discharging at least a part of the plurality of capacitors, and supplies electric energy accumulated in at least a part of the plurality of capacitors to said source; and
   a controller which controls the plurality of switches to select at least a part of the plurality of capacitors that supplies electric energy to said source.

2. An apparatus according to claim 1, wherein the plurality of switches are so arranged as to allow said controller to select a part of the plurality of capacitors to be discharged.

3. An apparatus according to claim 1, wherein at least two of the plurality of capacitors have different electrostatic capacitances.

4. An apparatus according to claim 1, wherein said controller controls the plurality of switches so as to supply electric energy to said source by using a capacitor of a first group of the plurality of capacitors in a first state, and supply electric energy to said source by using a capacitor of a second group of the plurality of capacitors in a second state.

5. An apparatus according to claim 4, wherein at least one of the plurality of capacitors belongs to both the first and second groups.

6. An apparatus according to claim 4, wherein each capacitor belonging to the first group is different from each capacitor belonging to the second group.

7. An apparatus according to claim 1, wherein said controller selects a part of the plurality of capacitors based on a cumulative value of intensity of the ray generated by said source.

8. An apparatus according to claim 7, further comprising a sensor which detects the intensity of the ray generated by said source.

9. An apparatus according to claim 7, wherein said controller selects a part of the plurality of capacitors so that electric power supplied to said source decreases if the cumulative value exceeds a threshold.

10. An apparatus according to claim 9, further comprising a circuit which adjusts a voltage for charging the selected part of the plurality of capacitors.

11. An apparatus according to claim 1, wherein said source generates a pulse ray by electric energy supplied from said electric energy supply circuit.

12. An exposure apparatus comprising:
    a generation apparatus defined in claim 1; and
    an exposure system which has a stage for holding an object and exposes the object to the ray, through a mask, generated by said generation apparatus.

13. A device manufacturing method comprising steps of:
    exposing an object to a ray through a mask, the ray being generated by controlling a plurality of switches for charging and discharging at least a part of a plurality of capacitors so as to select at least a part of the plurality of capacitors that supplies electric energy to a source for generating one of an X-ray and an extreme ultraviolet ray; and
    developing the exposed object.

14. An exposure apparatus which exposes an object to a ray through a mask, said apparatus comprising:
    a source which generates one of an X-ray and an extreme ultraviolet ray upon reception of electric energy;
    an electric energy supply circuit which has a plurality of capacitors and a plurality of switches for charging and discharging at least a part of the plurality of capacitors, and supplies electric energy accumulated in at least a part of the plurality of capacitors to said source;
    a sensor which detects an intensity of the ray generated by said source; and
    a controller which controls the plurality of switches to select at least the part of the plurality of capacitors that supplies electric energy to said source, so that electric power supplied to said source after a cumulative value of intensity detected by said sensor exceeds a threshold is lower than electric power supplied to said source before the cumulative value exceeds the threshold.

15. A device manufacturing method comprising steps of:

exposing an object to a ray through a mask, the ray being generated by controlling a plurality of switches for charging and discharging at least a part of a plurality of capacitors so as to select at least a part of the plurality of capacitors that supplies electric energy to a source for generating one of an X-ray and an extreme ultraviolet ray, so that electric power supplied to the source after a cumulative value of intensity of the ray generated by the source exceeds a threshold is lower than electric power supplied to the source before the cumulative value exceeds the threshold; and developing the exposed object.

* * * * *

UNITED STATES PATENT AND TRADEMARK OFFICE
CERTIFICATE OF CORRECTION

PATENT NO. : 6,891,927 B2
DATED : May 10, 2005
INVENTOR(S) : Atsushi Kitaoka

It is certified that error appears in the above-identified patent and that said Letters Patent is hereby corrected as shown below:

Column 3,
Line 54, "or-extreme" should read -- or extreme --.

Signed and Sealed this

Twentieth Day of September, 2005

JON W. DUDAS
*Director of the United States Patent and Trademark Office*